(12) United States Patent
Wang et al.

(10) Patent No.: US 11,588,123 B2
(45) Date of Patent: Feb. 21, 2023

(54) PROTECTIVE FILM, DISPLAY MODULE, DISPLAY ASSEMBLY, METHOD FOR PREPARING DISPLAY ASSEMBLY AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Fengxian Wang, Beijing (CN); Wen Huang, Beijing (CN); Xianlei Bi, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 174 days.

(21) Appl. No.: 17/214,066

(22) Filed: Mar. 26, 2021

(65) Prior Publication Data
US 2021/0408411 A1    Dec. 30, 2021

(30) Foreign Application Priority Data
Jun. 30, 2020   (CN) .......................... 202010614391.1

(51) Int. Cl.
| H01L 51/00 | (2006.01) |
| C09J 7/38  | (2018.01) |
| H01L 27/32 | (2006.01) |
| H01L 51/56 | (2006.01) |

(52) U.S. Cl.
CPC .......... *H01L 51/0097* (2013.01); *C09J 7/385* (2018.01); *H01L 27/3276* (2013.01); *H01L 51/003* (2013.01); *H01L 51/56* (2013.01); *C09J 2301/208* (2020.08); *C09J 2433/00* (2013.01); *C09J 2475/00* (2013.01); *H01L 2227/326* (2013.01); *H01L 2251/5338* (2013.01)

(58) Field of Classification Search
None
See application file for complete search history.

(56) References Cited

U.S. PATENT DOCUMENTS

2020/0264669 A1\*   8/2020   Namkung ............. G06F 1/1643

\* cited by examiner

*Primary Examiner* — Joe E. Schoenholtz
(74) *Attorney, Agent, or Firm* — ArentFox Schiff LLP; Michael Fainberg

(57) ABSTRACT

The present disclosure discloses a protective film, a display module, a display assembly, a method for preparing the display assembly and a display device. The protective film is configured to be attached to a surface on a display side of the flexible display substrate before a mother set is cut. The protective film includes a base material layer, a first adhesive layer and a second adhesive layer, wherein the first adhesive layer is located on the side, facing the flexible display substrate, of the base material layer; the viscosity of the first adhesive layer is 0.5 gf/inch to 1.5 gf/inch; the second adhesive layer is located on the side, facing the flexible display substrate, of the base material layer, is independently arranged relative to the first adhesive layer; and the viscosity of the second adhesive layer is 3 gf/inch to 4 gf/inch.

20 Claims, 4 Drawing Sheets

PROTECTIVE FILM, DISPLAY MODULE, DISPLAY ASSEMBLY, METHOD FOR PREPARING DISPLAY ASSEMBLY AND DISPLAY DEVICE

CROSS REFERENCE TO RELATED APPLICATIONS

The present disclosure claims priority to Chinese Patent Application No. 202010614391.1 filed with the China National Intellectual Property Administration on Jun. 30, 2020, the entire contents of which are incorporated herein by its reference.

FIELD

The present disclosure relates to the field of display technology, and particularly relates to a protective film, a display module, a display assembly, a method for preparing the display assembly and a display device.

BACKGROUND

An organic light emitting display (OLED) is flexible and a flexible full-screen display becomes a new development trend.

At present, a signal line at Pad Bending region of a flexible OLED (Flex OLED) is a single layer, and in order to improve the bending resistance of the region, a mainstream scheme of OLED screen manufacturers at present includes that the Pad Bending region is protected by spraying an MCL (Metal Coating Layer) on it. However, the sprayed MCL may cause the display border proximate to the bending region to be large in width and difficult to be reduced, and implementation of a narrow border is not facilitated.

SUMMARY

The present disclosure discloses a protective film, a display module, a display assembly, a method for preparing the display assembly and a display device.

The present disclosure provides the following embodiments.

In a first aspect, a protective film provided by an embodiment according to the present disclosure is configured to be attached to a flexible display substrate before a mother set is cut, and the flexible display substrate includes a display region and a bending region adjacent to the display region; and the protective film includes:

a base material layer, located on a display side of the flexible display substrate and configured to cover a surface, on the display side, of the flexible display substrate, wherein a projection of the base material layer on the flexible display substrate is overlapped with the display region and the bending region;

a first adhesive layer, located on a side, facing the flexible display substrate, of the base material layer and configured to cover the display region of the flexible display substrate; wherein viscosity of the first adhesive layer is 0.5 gf/inch to 1.5 gf/inch; and a second adhesive layer, located on the side, facing the flexible display substrate, of the base material layer, independently arranged relative to the first adhesive layer and configured to cover the bending region of the flexible display substrate; wherein viscosity of the second adhesive layer is 3 gf/inch to 4 gf/inch.

In some embodiments, an edge, proximate to the second adhesive layer, of the first adhesive layer and an edge, proximate to the first adhesive layer, of the second adhesive layer is smaller than 0.25 mm.

In some embodiments, an edge, proximate to the second adhesive layer, of the first adhesive layer is in contact with an edge, proximate to the first adhesive layer, of the second adhesive layer.

In some embodiments, a thickness of the second adhesive layer is 60 μm to 120 μm.

In some embodiments, the first adhesive layer is a non-ultraviolet curing adhesive, and the second adhesive layer is an ultraviolet curing adhesive.

In some embodiments, the first adhesive layer is a PU adhesive, and the second adhesive layer is an acrylic adhesive.

In some embodiments, the flexible display substrate further comprises a peripheral region around the display region; the first adhesive layer is configured to completely cover the display region; and a projection of an edge, proximate to the second adhesive layer, of the first adhesive layer on the flexible display substrate is located in the peripheral region or is coincided with an edge, adjacent to the bending region, of the peripheral region.

In some embodiments, wherein the flexible display substrate further comprises a peripheral region around the display region; the second adhesive layer is configured to completely cover the bending region; and a projection of an edge, proximate to the first adhesive layer, of the second adhesive layer on the flexible display substrate is located in the peripheral region or is coincided with an edge, adjacent to the bending region, of the peripheral region.

A display module includes the flexible display substrate and the protective film described according to the above embodiments.

In some embodiments, a distance between a projection of an edge, proximate to the first adhesive layer, of the second adhesive layer on the flexible display substrate and an edge, proximate to the bending area, of the display region is 0.9 mm to 1.2 mm.

In some embodiments, the flexible display substrate is provided with a screen portion and a bonding portion adjacent to the screen portion, and a width of the bonding portion is smaller than that of the screen portion; and the screen portion includes the display region, and the bonding portion includes the bending region; and a projection of an edge, proximate to the display region, of the second adhesive layer on the flexible display substrate is coincided with a boundary between the screen portion and the bonding portion.

In some embodiments, an area of the display region accounts for 92.38%-92.48% of an area of the screen portion.

A display assembly includes:

a flexible display substrate, including a display region and a bending region adjacent to the display region; and a second adhesive layer, attached to a surface of a display side of the flexible display substrate and covering the bending region, wherein the second adhesive layer is an adhesive layer which is obtained by removing a base material layer and a first adhesive layer from the protective film described above.

In some embodiments, a distance between a projection of an edge, proximate to the first adhesive layer, of the second adhesive layer on the flexible display substrate and an edge, proximate to the bending area, of the display region is 0.9 mm to 1.2 mm.

In some embodiments, the flexible display substrate is provided with a screen portion and a bonding portion adjacent to the screen portion, and a width of the bonding portion is smaller than that of the screen portion; and the screen portion includes the display region, and the bonding portion includes the bending region; and a projection of an edge, proximate to the display region, of the second adhesive layer on the flexible display substrate is coincided with a boundary between the screen portion and the bonding portion.

In some embodiments, an area of the display region accounts for 92.38%-92.48% of an area of the screen portion.

A method for preparing the display assembly includes:

preparing the protective film according to some embodiments above;

attaching the protective film to the flexible display substrate, and performing ultraviolet curing on the second adhesive layer of the protective film;

performing a bonding process on the flexible display substrate; and removing the base material layer and the first adhesive layer of the protective film from the flexible display substrate.

In some embodiments, the attaching the protective film to the flexible display substrate includes:

attaching the protective film to the mother set, wherein the mother set includes a plurality of flexible display substrates; and the method further includes: after the protective film is attached to the flexible display substrate, obtaining the flexible display substrate by performing unit cutting on the mother set.

A display device includes the display assembly according to some embodiments above.

DETAILED DESCRIPTION OF THE EMBODIMENTS

At present, on the market, all terminal flagship handsets have ultra-narrow borders in design, and the trend of full-screen displays wins support among people and becomes popular in consumers. However, an existing Flex Oled Pad Bending scheme has become the first choice of an ultra-narrow border, but due to the fact that the Pad Bending region is dense in wiring and large in reverse bending stress so that a plurality of cracks exist in the Pad Bending region, and thus, product disclosure is seriously restricted. In order to solve the problem, a current solution is to spray a protective layer (MCL, Metal Coating Layer) on a bending region.

Figure 7:
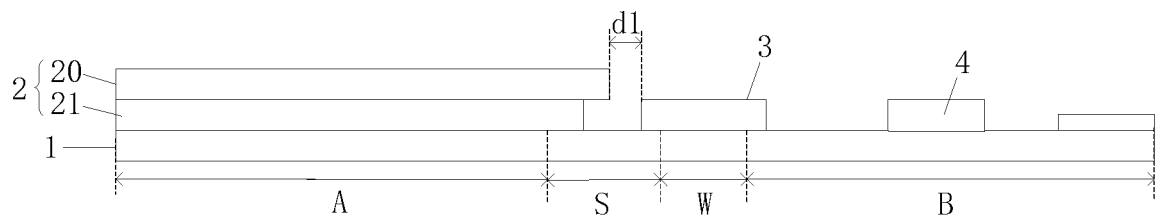
FIG. 7 is a schematic diagram of a cross-sectional structure of a display module along the X1-X2 direction in FIG. 1 in related art.

During research, the inventor finds that although the sprayed protective layer (MCL) can protect the Pad Bending region, the transition range from the initial position to the uniform position of an MCL adhesive material is large due to limitation of precision and process of equipment spraying, the sprayed MCL is often poor in thickness uniformity and serious in edge saw-teeth, so that the spraying range of the MCL adhesive material is large, and a border (Panel Down Border) on one side of the bending region of a display panel is difficult to shrink. Moreover, the process flow of an existing Flex OLED is as follows: attaching a top protective film (TPF) to a light emitting side of a flexible substrate, spraying an MCL, carrying out bonding process (FOP Bonding), tearing off the top protective film (TPF), and attaching a polarizer (POL), as shown in FIG. 7, the top protective film (TPF) 2 of a display substrate needs to be peeled off before the POL is attached, in order to prevent the sprayed MCL adhesive material 3 from interfering with the TPF 2 (if the MCL adhesive material 3 interferes with the TPF 2 when sprayed to the TPF 2, the MCL adhesive material 3 will be peeled off when the TPF 2 is torn off), the distance dl between the spraying edge of the MCL adhesive material 3 and the edge of the TPF 2 generally needs to be greater than or equal to 0.3 mm, therefore, the distance between the spraying edge of the MCL adhesive material 3 and the edge of the display region A needs to be larger, and the width of the border of the bent side is difficult to reduce further. In view of the problems, it is very necessary to effectively enhance and improve the protection mode of the bending region of the flexible display substrate.

In some embodiments, an embodiment of the present disclosure provides a protective film, a display module, a display assembly, a method for preparing the display assembly and a display device, and aims to provide a protection scheme for the bending region of a flexible display substrate so as to reduce the width of a border on one side of the bending region of the display substrate and realize a narrow border.

The technical solutions in the embodiments of the present disclosure will be described clearly and completely with reference to the drawings in the embodiments of the present disclosure, and it is obvious that the described embodiments are only some embodiments of the present disclosure, and not all embodiments. All other embodiments obtained by a person of ordinary skill in the art based on the embodiments in the present disclosure without making any creative effort belong to the protection scope of the present disclosure.

Figure 1:
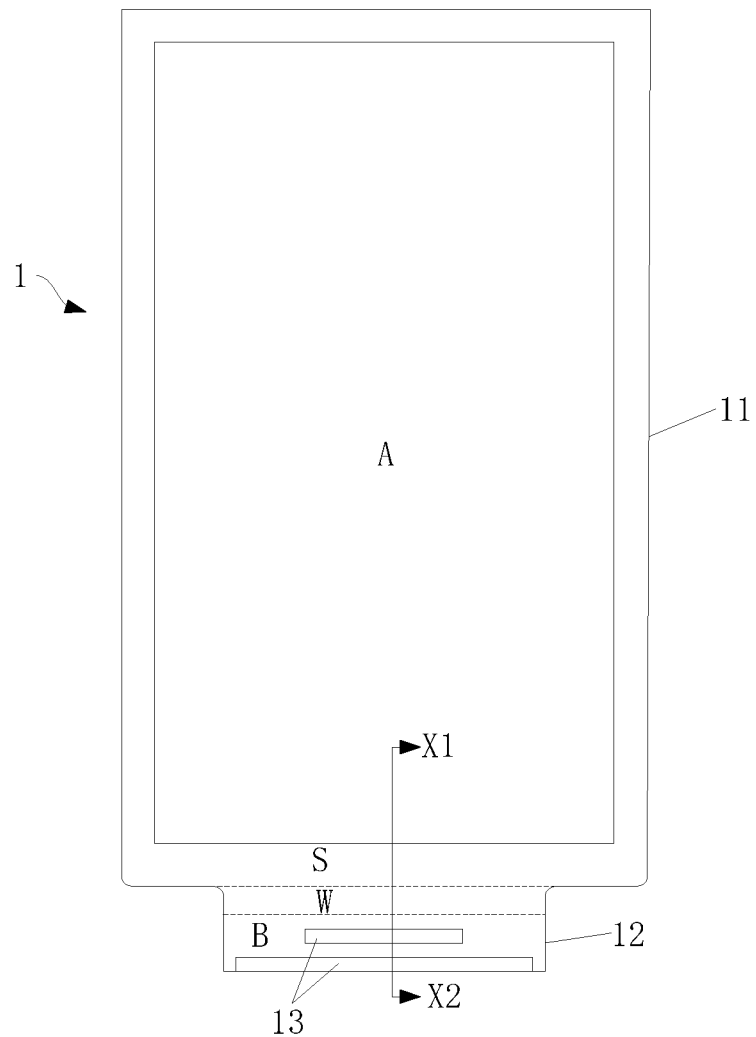
FIG. 1 is a structure diagram of a flexible display substrate provided by embodiments of the present disclosure.

As shown in FIG. 1, a conventional flexible display substrate 1 is provided with a screen portion 11 and a bonding portion (a tongue portion) 12 adjacent to the screen portion 11, and a length of the bonding portion 12 in the second direction is smaller than a length of the screen portion 11 in the second direction, and a width of the bonding portion 12 in the first direction is smaller than a width of the screen portion 11 in the first direction. Taking a flexible display substrate in a mobile phone as an example, the bonding portion 12 of the flexible display substrate is located on the lower side (as shown in FIG. 1) of the screen portion 11. Wherein the first direction is the X1-X2 direction, and the second direction is the direction perpendicular to X1-X2 and parallel to the plane where the flexible display substrate 1 is located.

The screen portion 11 is provided with a display region A and a peripheral region S arranged around the display region A. The peripheral region S is used for wiring, for example, for being arranged with a gate drive circuit.

The bonding portion 12 is provided with an electric connection region B and a bending region W, the bending region W is located between the peripheral region S and the electric connection region B, and the electric connection region B is provided with a connection structure 13 used for being electrically connected with a drive IC (Integrated Circuit Chip) and/or a flexible printed circuit (FPC); and the bending region W is used for overturning the electric connection region B and the drive IC and/or FPC electrically connected with the electric connection region B to the back side (the side facing away from the display side of the flexible display substrate 1) of the flexible display substrate 1.

Figure 2:
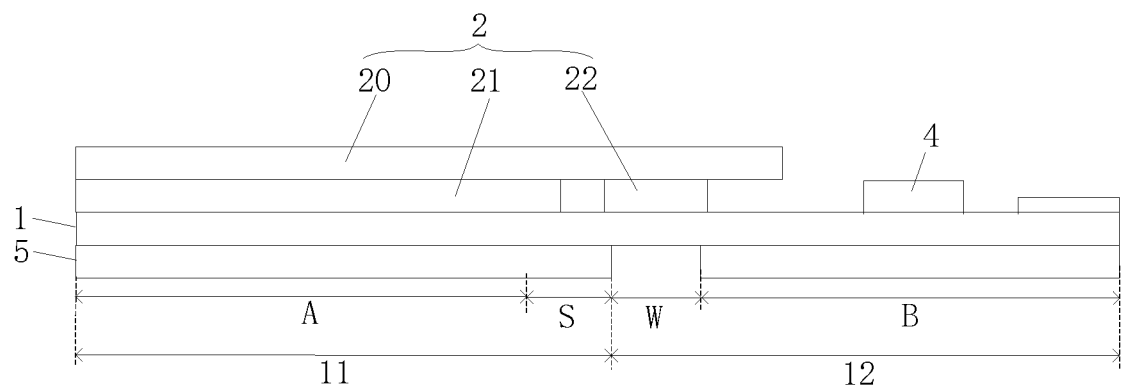
FIG. 2 is a schematic diagram of a cross-sectional structure of a display module along the X1-X2 direction in FIG. 1 provided by an embodiment of the present disclosure.
Figure 3:
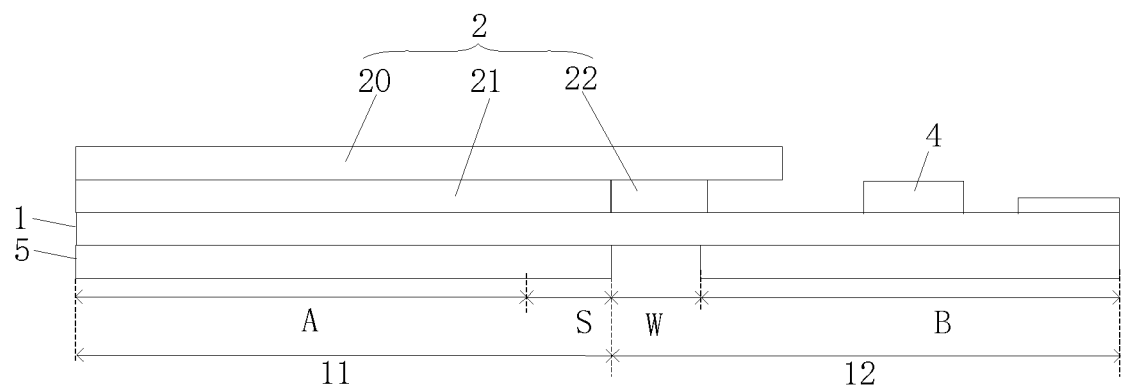
FIG. 3 is a schematic diagram of a cross-sectional structure of a display module along the X1-X2 direction in FIG. 1 provided by another embodiment of the present disclosure.
Figure 4:
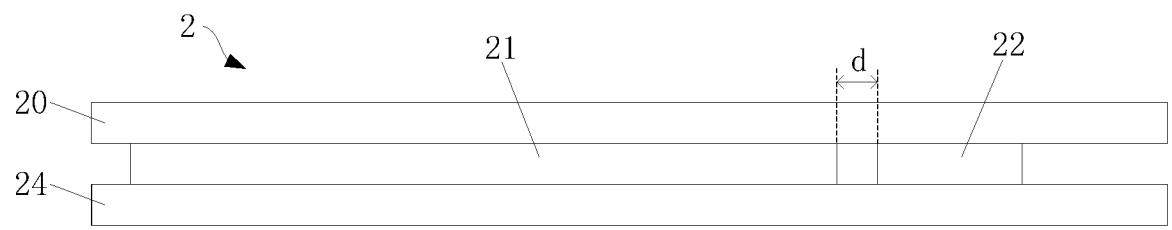
FIG. 4 is a schematic diagram of a cross-sectional structure of a protective film provided by an embodiment of the present disclosure.
Figure 5:
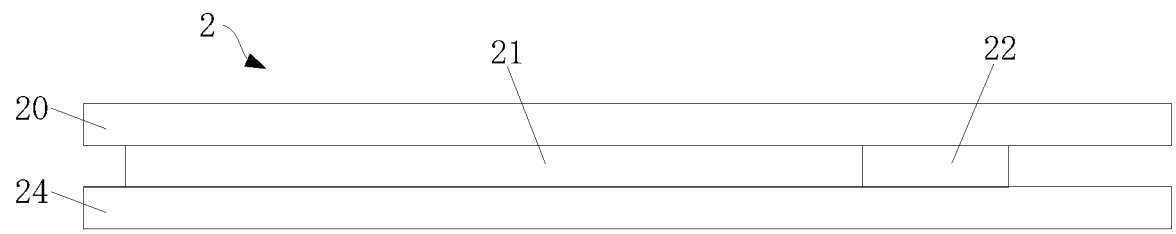
FIG. 5 is a schematic diagram of a cross-sectional structure of a protective film provided by another embodiment of the present disclosure.

An embodiment of the present disclosure provides a protective film, and the protective film is configured to be attached to a display surface of a flexible display substrate before a mother set is cut. As shown in FIG. 1 to FIG. 3, the flexible display substrate 1 includes a display region A and a bending region W adjacent to the display region A; and as shown in FIG. 4 and FIG. 5, the protective film 2 includes a base material layer 20, a first adhesive layer 21 and a second adhesive layer 22.

As shown in FIG. 1 to FIG. 3, in the protective film 2:

the base material layer 20 is located on a display side of the flexible display substrate 1 and configured to cover a surface of, the display side of, the flexible display substrate 1, and the projection of the base material layer 20 on the flexible display substrate 1 is overlapped with the display region A and the bending region W;

the first adhesive layer 21 is located on the side, facing the flexible display substrate 1, of the base material layer 20 and is configured to cover the display region A of the flexible display substrate 1; and the viscosity of the first adhesive layer 21 is 0.5 gf/inch to 1.5 gf/inch;

the second adhesive layer 22 is located on the side, facing the flexible display substrate 1, of the base material layer 20, is independently arranged relative to the first adhesive layer 21 and is configured to cover the bending region W of the flexible display substrate 1; the second adhesive layer 22 is an ultraviolet curing adhesive; and the viscosity of the second adhesive layer 22 is 3 gf/inch to 4 gf/inch.

The protective film 2 is used for being attached to the display side of the flexible display substrate 1 before the mother set is cut so as to protect the flexible display substrate 1, and the protective film 2 may be peeled off before a polarizer attaching process is carried out, so that the flexible display substrate 1 may continue to be subjected to the subsequent attaching process.

Figure 6:
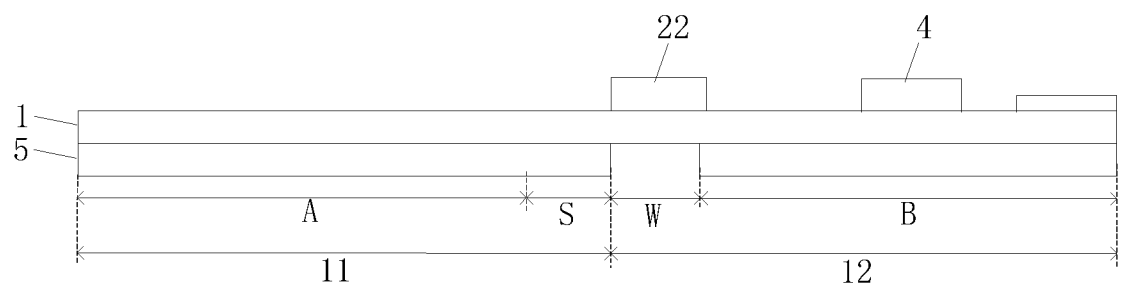
FIG. 6 is a schematic diagram of a cross-sectional structure of a display assembly along the X1-X2 direction in FIG. 1 provided by an embodiment of the present disclosure.

In some embodiments, the base material layer 20 of the protective film 2 not only covers the display region A of the flexible display substrate 1, but also covers the bending region W of the flexible display substrate 1; moreover, the protective film 2 includes two adhesive layers, namely the first adhesive layer 21 and the second adhesive layer 22; wherein the first adhesive layer 21 covers the display region A, the viscosity of the first adhesive layer 21 is smaller and is about 0.5 gf/inch to 1.5 gf/inch, the first adhesive layer 21 is mainly used for attaching the base material layer 20 and a main body of the flexible display substrate 1 together, and the first adhesive layer 21 is peeled off along with the base material layer 20 when the protective film 2 is torn off; the second adhesive layer 22 covers the bending region W, is relatively higher in viscosity which is about 3 gf/inch to 4 gf/inch, adopts an ultraviolet curing adhesive, may be adhered and fixed to the flexible display substrate 1 after ultraviolet curing, and may not be peeled off along with the base material layer 20 when the protective film 2 is torn off (as shown in FIG. 6, the second adhesive layer 22 is adhered to the flexible display substrate 1 after the protective film is torn off), and then the second adhesive layer 22 is finally attached to the flexible display substrate 1 to form an MCL (Metal Coating Layer), so that the bending region W of the flexible display substrate 1 is protected.

In conclusion, by adopting the protective film 2, the MCL adhesive layer (the second adhesive layer 22) can be formed in the bending region W of the flexible display substrate 1 in an attached mode. Compared with an MCL formed by a spraying process (shown in FIG. 7 as spraying an MCL adhesive material 3), the uniformity and precision of the attached MCL adhesive layer are easier to control, effective coverage and protection on the bending region W may be ensured by adopting a smaller attaching area, and the distance from the edge, proximate to the display region A, of the bending region W to the edge, proximate to the bending region W, of the display region A may be further reduced as shown in FIG. 2 and FIG. 3; moreover, because the MCL adhesive layer (the second adhesive layer 22) in the present disclosure is attached together with the protective film (TPF) 2, compared with an MCL spraying process, the attaching mode has the characteristics that avoidance between the MCL adhesive material (the second adhesive layer 22) and the protective film 2 does not need to be considered, so that the distance between the projection of the edge, proximate to the first adhesive layer 21, of the MCL adhesive layer (the second adhesive layer 22) on the flexible display substrate 1 and the edge, proximate to the bending region W, of the display region A may be reduced as shown in FIG. 2 and FIG. 3, the distance between the edge, proximate to the bending region W, of the display region A and the edge, proximate to the display region A, of the bending region W may be further compressed to reduce the border, and a narrow border or an ultra-narrow border of the display substrate on one edge of the bending region W is realized.

Besides, in the conventional MCL spraying process, an MCL is sprayed by using a needle tube, four or more times of continuous spraying is required at least, the energy consumption is high, and secondary damage to Pad Bending is caused during spraying; and moreover, an MCL adhesive needs twice UV curing, during first spraying, curing is required at first until whole coating is completed, unified curing is performed and the UV curing time is long. However, in the present disclosure, according to the solution that the MCL adhesive layer is attached to the flexible substrate through the protective film, one-time UV curing may be omitted technically, the cost is saved, and moreover, the reliability of the product may be improved; for example, the MCL adhesive adopts an attaching process, spraying damage may be avoided, attaching is completed before the flexible display substrate is formed through cutting of the mother set, supporting may be provided by means of a rigid substrate (a glass base material), and therefore, the risk of Pad Bending Crack is greatly reduced; and moreover, the base material layer of the protective film (TPF) extends to cover a Pad Bending region, so that the reliability of the flexible display substrate in the subsequent transportation process may be greatly improved, and the risk of crack is further reduced.

In some embodiments, the bending region of the flexible display substrate generally includes a flexible substrate and multiple material layers, such as an inorganic material layer and a metal wiring layer, located on the flexible substrate. In the present disclosure, the MCL (Metal Cover Layer) adhesive layer is attached to the bending region, and the positions of the inorganic material layer and the metal wiring layer in the bending region may be adjusted, so that the inorganic material layer and the metal wiring layer are located at the position of the neutral layer in the bending region, and the possibility that the inorganic material layer and the metal wiring layer in the bending region are broken in the bending process is reduced.

In some embodiments, as shown in FIG. 4, in the protective film 2, the distance d between the edge, proximate to the second adhesive layer 22, of the first adhesive layer 21 and the edge, proximate to the first adhesive layer 21, of the second adhesive layer 22 is smaller than 0.25 mm.

Illustratively, as shown in FIG. 5, in the protective film 2, the edge, proximate to the second adhesive layer 22, of the first adhesive layer 21 is in contact with the edge, proximate to the first adhesive layer 21, of the second adhesive layer 22.

In some embodiments, the first adhesive layer 21 completely covers the display region A, and the projection of the edge, proximate to the second adhesive layer 22, of the first adhesive layer 21 on the flexible display substrate 1 may be located in a peripheral region S (as shown in FIG. 2) and may also be coincided with the edge (the boundary between the screen portion 11 and the bonding portion 12) of the peripheral region S (as shown in FIG. 3). The second adhesive layer 22 completely covers the bending region W, and the projection of the edge, proximate to the first adhesive layer 21, of the second adhesive layer 22 on the flexible display substrate 1 may be located in the peripheral region S (as shown in FIG. 2) and may also be coincided with the edge (the boundary between the screen portion 11 and the bonding portion 12) of the peripheral region S (as shown in FIG. 3).

For example, as shown in FIG. 3, the edge, proximate to the second adhesive layer 22, of the first adhesive layer 21 and the edge, proximate to the first adhesive layer 21, of the second adhesive layer 22 are in contact with each other and the projections of the edges on the flexible display substrate 1 are coincided with the edge (the boundary between the screen portion 11 and the bonding portion 12), proximate to the bending region W, of the peripheral region S.

In a conventional MCL spraying process, as shown in FIG. 7, the distance d1 between the edge, proximate to the protective film 2, of the sprayed MCL adhesive material 3 and the edge, proximate to the MCL adhesive material 3, of the protective film 2 is generally greater than 0.3 mm, such as 0.3 mm to 0.4 mm, so that the distance between the edge, proximate to the bending region W, of the display region A and the edge, proximate to the display region A, of the bending region W needs to be set relatively large, namely, the width of the peripheral region S between the display region A and the bending region W is relatively large. In the present disclosure, as shown in FIG. 2 and FIG. 3, the MCL adhesive layer (the second adhesive layer 22) is arranged on the base material layer 20 of the protective film 2 and attached to the flexible display substrate 1 at the same time with the protective film 2, and the distance between the edge, proximate to the first adhesive layer 21, of the second adhesive layer 22 and the edge, proximate to the second adhesive layer 22, of the first adhesive layer 21 is very small, for example, the distance may be smaller than 0.25 mm and even may be 0 (the edge, proximate to the first adhesive layer 21, of the second adhesive layer 22 is in contact with the edge, proximate to the second adhesive layer 22, of the first adhesive layer 21), the distance between the edge, proximate to the bending region W, of the display region A covered by the first adhesive layer 21 and the edge, proximate to the display region A, of the bending region W covered by the second adhesive layer 22 may be set to be very small, namely the width of the peripheral region S located between the display region A and the bending region W is small, and therefore, a narrow border or an ultra-narrow border may be achieved.

In some embodiments, the thickness of the second adhesive layer 22 is between 60 μm and 120 μm.

In some embodiments of the present disclosure, the second adhesive layer on the protective film may be formed on the base material layer through a printing process, and the shape range of the second adhesive layer may be defined through the patterning process, so that compared with an MCL adhesive layer directly formed on the flexible display substrate 1 through spraying, the second adhesive layer may be formed with the thickness uniformity and thinning so that implementation of a narrow border in the bending region is facilitated, and the narrow border effect of the product is further improved. Moreover, due to thickness setting of the second adhesive layer, the inorganic material layer and the metal wiring layer may be located at the position of the neutral layer of the bending region, so that the possibility that the inorganic material layer and the metal wiring layer are broken in the bending process is effectively reduced.

In some embodiments, the first adhesive layer 21 is a non-ultraviolet curing adhesive (non-UV curing adhesive). The second adhesive layer 22 is an ultraviolet curing adhesive. When the second adhesive layer 22 is subjected to UV curing, UV has no influence on the first adhesive layer 21.

Illustratively, the first adhesive layer 21 is a PU adhesive, and the second adhesive layer 22 is an acrylic adhesive. In some embodiments, after the second adhesive layer 22 is subjected to UV curing, the bending performance of the adhesive layer 22 is good, and the adhesive force between the second adhesive layer 22 and the flexible display substrate 1 may reach 13.3 N/mm$^2$.

In some embodiments, as shown in FIG. 4 and FIG. 5, the protective film 2 of an embodiment of the present disclosure may further include a release film 24 arranged on the sides, away from the base material layer 20, of the first adhesive layer 21 and the second adhesive layer 22. The release film 24 is torn off before the protective film 2 is attached.

Some embodiments of the present disclosure further provide a display module, as shown in FIG. 2 and FIG. 3, and the display module includes a flexible display substrate 1 and any one protective film 2 according to the above embodiments.

In some embodiments, the protective film 2 is attached to the surface on the display side of the flexible display substrate 1; wherein the first adhesive layer 21 covers the display region A of the flexible display substrate 1, and the second adhesive layer 22 covers the bending region W of the flexible display substrate 1.

In some embodiments, as shown in FIG. 3, the flexible display substrate 1 is provided with a screen portion 11 and a bonding portion 12 adjacent to the screen portion 11, the width of the bonding portion 12 in the second direction is smaller than a width of the screen portion 11 in the second direction, and a length of the binding portion 12 in the first direction is smaller than a length of the screen portion 11 in the first direction; and the screen portion 11 includes the display region A, and the bonding portion 12 includes the bending region W. Wherein the first direction is the X1-X2 direction, and the second direction is the direction perpendicular to X1-X2 and parallel to the plane where the flexible display substrate 1 is located.

Illustratively, the projection of the edge, proximate to the first adhesive layer 21, of the second adhesive layer 22 on the flexible display substrate 1 is coincided with the boundary between the screen portion 11 and the bonding portion 12.

Illustratively, the distance between the projection of the edge, proximate to the first adhesive layer 21, of the second adhesive layer 22 on the flexible display substrate 1 and the edge, proximate to the bending region W, of the display region A is 0.9 mm to 1.2 mm.

For example, as shown in FIG. 3, the projection of the edge, proximate to the first adhesive layer 21, of the second adhesive layer 22 on the flexible display substrate 1 is coincided with the boundary between the screen portion 11 and the bonding portion 12. The distance between the projection of the edge, proximate to the first adhesive layer 21, of the second adhesive layer 22 on the flexible display substrate 1 and the edge, proximate to the bending region W, of the display region A is the width of the peripheral region S in the first direction between the screen portion 11 and the bonding portion 12, the width is 0.9 mm to 1.2 mm and may be reduced by 0.25 mm to 0.4 mm compared with the width (shown in the FIG. 7) of the peripheral region S of the flexible display substrate 1 in a conventional MCL spraying scheme, further compression on the narrow border is achieved, the screen-to-body ratio is increased, and the full-screen display effect is improved.

Illustratively, in the flexible display substrate 1 provided by an embodiment of the present disclosure, the area of the display region A accounts for 92.38%-92.48% of the area of the screen portion 11. In some embodiments, when the flexible display substrate 1 is applied to a mobile phone product, the screen-to-body ratio of the mobile phone product may be increased by about 0.12%-0.28%. For example, for a 6.18-inch mobile phone product, the conventional screen-to-body ratio is generally about 92.18%, and the screen-to-body ratio of the mobile phone product applying the flexible display substrate 1 in the present disclosure may reach about 92.43%.

Of course, the edge positions of the first adhesive layer 21 and the second adhesive layer 22 in the present disclosure are not limited to the embodiments described above. For example, as shown in FIG. 2, the projection of the edge, proximate to the first adhesive layer 21, of the second adhesive layer 22 on the flexible display substrate 1 and/or the projection of the edge, proximate to the second adhesive layer 22, of the first adhesive layer 21 on the flexible display substrate 1 may also not be coincided with the boundary between the screen portion and the bonding portion 12, but be located in the peripheral region S. In addition, a certain distance may also be reserved between the edge, proximate to the first adhesive layer 21, of the second adhesive layer 22 and the edge, proximate to the second adhesive layer 22, of the first adhesive layer 21, and the distance is smaller than 0.25 mm.

In some embodiments, as shown in FIG. 2 and FIG. 3, the display module provided by the embodiment of the present disclosure may further include an IC chip 4 connected with an electric connection region B, an FPC (not shown in the figures), a film layer 5 located on the back side of the flexible display substrate 1 and the like, and the film layer 5 on the back side is not overlapped with the bending region W so as to improve the bending reliability.

An embodiment of the present disclosure also provides a display assembly, as shown in FIG. 6, the display assembly includes:

a flexible display substrate 1, including a display region A and a bending region W adjacent to the display region A; and a second adhesive layer 22, attached to the surface of the display side of the flexible display substrate 1 and covering the bending region W, wherein the second adhesive layer 22 is an adhesive layer which is obtained by removing the base material layer 20 and the first adhesive layer 21 from the protective film 2 according to the embodiments above.

In some embodiments, the display module (as shown in FIG. 2 and FIG. 3) provided by the embodiment of the present disclosure is in a module form after the protective film 2 is attached to the display side of the flexible display substrate 1 and before the protective film 2 is peeled off (before a polarizer attaching process is carried out). The display assembly (as shown in FIG. 6) provided by the embodiment of the present disclosure may be an assembly product obtained after the protective film of the display module is peeled off.

In some embodiments, the display assembly provided by the embodiment of the present disclosure may be an assembly product after a polarizer and/or glass cover plate attaching process is carried out, namely the display assembly may further include layer structures such as a polarizer and a glass cover plate.

As shown in FIG. 6, in some embodiments, the flexible display substrate 1 is provided with a screen portion 11 and a bonding portion 12 adjacent to the screen portion 11, and the width of the bonding portion 12 is smaller than that of the screen portion 11; wherein the screen portion 11 includes the display region A, and the bonding portion 12 includes the bending region W.

Illustratively, in the display assembly provided by the embodiment of the present disclosure, the projection of the edge, proximate to the first adhesive layer 21, of the second adhesive layer 22 on the flexible display substrate 1 is coincided with the boundary between the screen portion 11 and the bonding portion 12.

Illustratively, the distance between the projection of the edge, proximate to the first adhesive layer 21, of the second adhesive layer 22 on the flexible display substrate 1 and the edge, proximate to the bending area W, of the display region A is 0.9 mm to 1.2 mm.

For example, as shown in FIG. 6, the projection of the edge, proximate to the first adhesive layer 21, of the second adhesive layer 22 on the flexible display substrate 1 is coincided with the boundary between the screen portion 11 and the bonding portion 12. The distance between the projection of the edge, proximate to the first adhesive layer 21, of the second adhesive layer 22 on the flexible display substrate 1 and the edge, proximate to the bending area W, of the display region A is the width of the peripheral region S, in the first direction, located between the screen portion 11 and the bonding portion 12, the width is 0.9 mm to 1.2 mm and may be reduced by 0.25 mm to 0.4 mm compared with the width (as shown in FIG. 7) of the peripheral region S of the flexible display substrate 1 in a conventional MCL spraying scheme, further compression of the narrow border is achieved, the screen-to-body ratio is increased, and the full-screen display effect is improved.

Illustratively, in the flexible display substrate 1 provided by the embodiment of the present disclosure, the area of the display region A accounts for 92.38%-92.48% of the area of the screen portion 11. In some embodiments, when the flexible display substrate 1 is applied to a mobile phone product, the screen-to-body ratio of the mobile phone product may be increased by about 0.12%-0.28%. For example, for a 6.18-inch mobile phone product, the conventional screen-to-body ratio is generally about 92.18%, and the screen-to-body ratio of the mobile phone product applying the flexible display substrate 1 in the present disclosure may reach about 92.43%.

In some embodiments, the display assembly shown in FIG. 6 is in an assembly form obtained after the protective film 2 of the display module shown in FIG. 3 is torn off. In some embodiments, the edge positions of the first adhesive layer 21 and the second adhesive layer 22 in the present disclosure are not limited to that shown in FIG. 6 described above. For example, the display assembly in the present disclosure may also be in an assembly form obtained after the protective film 2 of the display module shown in FIG. 2 is torn off, and at the moment, the projection of the edge, proximate to the first adhesive layer 21, of the second adhesive layer 22 on the flexible display substrate 1 and the projection of the edge, proximate to the second adhesive layer 22, of the first adhesive layer 21 on the flexible display substrate are not coincided with the boundary between the screen portion and the bonding portion 12, but are located in the peripheral region S; and moreover, a certain distance is reserved between the edge, proximate to the first adhesive layer 21, of the second adhesive layer 22 and the edge, proximate to the second adhesive layer 22, of the first adhesive layer 21, and the distance is smaller than 0.25 mm.

In some embodiments, an embodiment of the present disclosure further provides a display device, and the display device includes the display assembly according to the embodiments above.

In some embodiments, in the display assembly provided by the embodiment of the present disclosure, the flexible display substrate may be an OLED substrate. The display device provided by the embodiment of the present disclosure may be a mobile phone, a tablet computer, a notebook computer, a personal digital assistant (PDA), a vehicle-mounted computer and the like. The embodiment of the present disclosure has no special limitation on the specific form of the display device.

Figure 8:
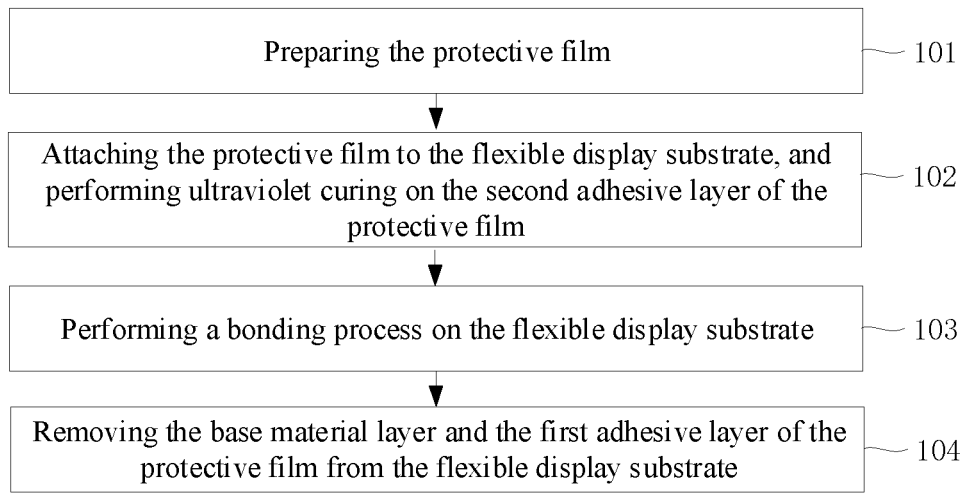
FIG. 8 is a flow chart of a method for preparing a display assembly provided by an embodiment of the present disclosure.

In some embodiments, an embodiment of the present disclosure further provides a method for preparing a display assembly, as shown in FIG. 8, the method includes the following steps.

Step 101, preparing the protective film according to the embodiments above (the protective film 2 shown in FIG. 4 and FIG. 5).

Step 102, attaching the protective film to the flexible display substrate, and performing ultraviolet curing on the second adhesive layer of the protective film (as shown in FIG. 2 and FIG. 3).

Step 103, performing a bonding process on the flexible display substrate.

Step 104, removing the base material layer and the first adhesive layer of the protective film from the flexible display substrate (as shown in FIG. 6, the flexible display substrate is in a form with the protective film torn off).

Figure 9:
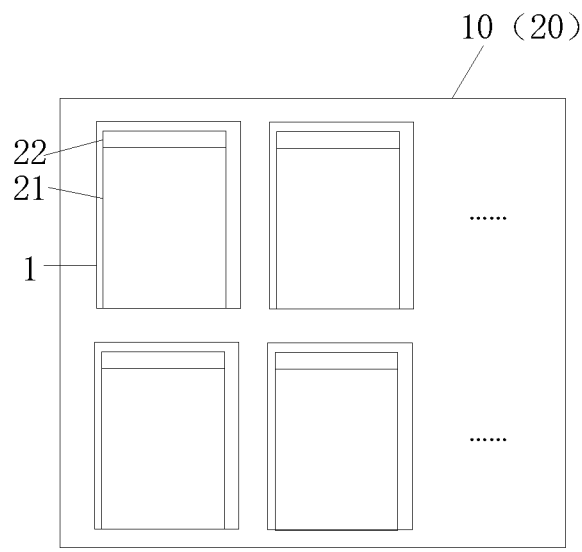
FIG. 9 is a structure diagram of a mother set provided by an embodiment of the present disclosure after a protective film is attached to the mother set.

In some embodiments, the step 102 of attaching the protective film to the flexible display substrate includes: as shown in FIG. 9, attaching the protective film (including the base material layer 20, the first adhesive layer 21 and the second adhesive layer 22) to the mother set 10. In some embodiments, the mother set 10 includes a plurality of flexible display substrates 1; the protective film may cover the whole mother set 10, patterns of a plurality of pairs of first adhesive layers 21 and second adhesive layers 22 are formed on the base material layer 20 of the protective film, and each pair of the first adhesive layer 21 and the second adhesive layer 22 correspondingly covers one flexible display substrate 1.

After the step 102, the method may further include: obtaining the flexible display substrate 1 by performing unit cutting on the mother set 10. In some embodiments, while the mother set 10 is cut, the base material layer 20 of the protective film is cut off, so that the cut protective films are in one-to-one correspondence to the flexible display substrates 1.

In some embodiments, the step 101 of preparing any one protective film described above may include:

providing the base material layer 20, which has a size roughly the same as that of the mother set 10, of the protective film; and successively preparing the first adhesive layer 21 and the second adhesive layer 22 on the base material layer 20.

Illustratively, the first adhesive layer 21 is a non-ultraviolet curing adhesive, and the second adhesive layer 22 is an ultraviolet curing adhesive. When UV curing is carried out on the second adhesive layer 22 (an MCL adhesive), UV has no influence on the first adhesive layer 21. For example, the first adhesive layer 21 is a PU adhesive, and the second adhesive layer 22 is an acrylic adhesive.

Illustratively, the thickness of the second adhesive layer 22 is 60 μm to 120 μm. The second adhesive layer 22 (an MCL adhesive layer) may be formed on the base material layer 20 of the protective film by a printing process, and the shape range of the second adhesive layer 22 may be defined through the patterning process; and compared with an MCL adhesive material formed directly on the display substrate through spraying, the second adhesive layer 22 may be formed with the thickness uniformity and thinning.

In some embodiments, in the conventional MCL spraying process, the MCL is sprayed through a needle tube, four or more times of continuous spraying is required at least, energy consumption is high, and secondary damage to Pad Bending is caused during spraying; moreover, the MCL adhesive needs twice UV curing, during first spraying, curing is required at first until the whole coating is completed, unified curing is performed and the UV curing time is long. However, in the present disclosure, the MCL adhesive layer is prepared on a top protective film (TPF), the MCL adhesive layer is attached to the flexible substrate through the TPF, according to the solution, on one hand, one-time UV curing may be omitted technically, the cost is saved, and on the other hand, the reliability of the product may be improved, for example, the integrated MCL adhesive adopts an attaching process, spraying damage may be avoided, attachment is completed before the flexible display substrate is formed through cutting of the mother set, supporting may be provided by means of a rigid substrate (a glass base material), and therefore, the risk of Pad Bending Crack is greatly reduced; and moreover, the base material layer of the protective film (TPF) extends to cover the Pad Bending region, so that the reliability of the flexible display substrate in the subsequent transportation process may be greatly improved, and the risk of crack is further reduced.

It should be noted that in some embodiments of the present disclosure, the protective film, the display assembly and the display device may also include other structures, which may be determined according to actual needs, and that the embodiments of the present disclosure are not limited thereto. The size and material selection of the structures of all parts provided by the embodiment of the present disclosure is not limited to the embodiment, may be changed according to actual needs, and is not described in detail here. Moreover, the drawings of the present disclosure are only schematic diagrams, and the sizes and proportions of the structures of the parts in the drawings do not represent the actual sizes and proportions of the structures.

It will be apparent for those skilled in the art that various modifications and modifications can be made to the embodiments of the present disclosure without departing from the spirit and scope of the present disclosure. Thus, if such modifications and variations of the present disclosure fall within the scope of the claims of the present disclosure and their equivalents, the present disclosure is intended to include such modifications and variations as well.

What is claimed is:

1. A protective film, configured to be attached to a flexible display substrate before a mother set is cut, the flexible display substrate comprising a display region and a bending region adjacent to the display region; wherein the protective film comprises:
    a base material layer, located on a display side of the flexible display substrate and configured to cover a surface, on the display side, of the flexible display substrate, wherein a projection of the base material layer on the flexible display substrate is overlapped with the display region and the bending region;
    a first adhesive layer, located on a side, facing the flexible display substrate, of the base material layer and configured to cover the display region of the flexible display substrate; wherein viscosity of the first adhesive layer is 0.5 gf/inch to 1.5 gf/inch; and
    a second adhesive layer, located on the side, facing the flexible display substrate, of the base material layer, independently arranged relative to the first adhesive layer and configured to cover the bending region of the flexible display substrate; wherein viscosity of the second adhesive layer is 3 gf/inch to 4 gf/inch.

2. The protective film according to claim 1, wherein a distance between an edge, proximate to the second adhesive layer, of the first adhesive layer and an edge, proximate to the first adhesive layer, of the second adhesive layer is smaller than 0.25 mm.

3. The protective film according to claim 1, wherein an edge, proximate to the second adhesive layer, of the first adhesive layer is in contact with an edge, proximate to the first adhesive layer, of the second adhesive layer.

4. The protective film according to claim 1, wherein a thickness of the second adhesive layer is 60 µm to 120 µm.

5. The protective film according to claim 1, wherein the first adhesive layer is a non-ultraviolet curing adhesive, and the second adhesive layer is an ultraviolet curing adhesive.

6. The protective film according to claim 5, wherein the first adhesive layer is a PU adhesive, and the second adhesive layer is an acrylic adhesive.

7. The protective film according to claim 1, wherein the flexible display substrate further comprises a peripheral region around the display region;
    the first adhesive layer is configured to completely cover the display region; and
    a projection of an edge, proximate to the second adhesive layer, of the first adhesive layer on the flexible display substrate is located in the peripheral region or is coincided with an edge, adjacent to the bending region, of the peripheral region.

8. The protective film according to claim 1, wherein the flexible display substrate further comprises a peripheral region around the display region;
    the second adhesive layer is configured to completely cover the bending region; and
    a projection of an edge, proximate to the first adhesive layer, of the second adhesive layer on the flexible display substrate is located in the peripheral region or is coincided with an edge, adjacent to the bending region, of the peripheral region.

9. A display module, comprising the flexible display substrate and the protective film according to claim 1.

10. The display module according to claim 9, wherein a distance between a projection of an edge, proximate to the first adhesive layer, of the second adhesive layer on the flexible display substrate and an edge, proximate to the bending area, of the display region is 0.9 mm to 1.2 mm.

11. The display module according to claim 9, wherein the flexible display substrate is provided with a screen portion and a bonding portion adjacent to the screen portion, and a width of the bonding portion is smaller than that of the screen portion; the screen portion comprises the display region, and the bonding portion comprises the bending region; and
    a projection of an edge, proximate to the display region, of the second adhesive layer on the flexible display substrate is coincided with a boundary between the screen portion and the bonding portion.

12. The display module according to claim 11, wherein an area of the display region accounts for 92.38%-92.48% of an area of the screen portion.

13. A display assembly, comprising:
    a flexible display substrate, comprising a display region and a bending region adjacent to the display region; and
    a second adhesive layer, attached to a surface of a display side of the flexible display substrate and covering the bending region, wherein the second adhesive layer is an adhesive layer which is obtained by removing the base material layer and the first adhesive layer from the protective film of claim 1.

14. The display assembly according to claim 13, wherein a distance between a projection of an edge, proximate to the first adhesive layer, of the second adhesive layer on the flexible display substrate and an edge, proximate to the bending area, of the display region is 0.9 mm to 1.2 mm.

15. The display assembly according to claim 13, wherein the flexible display substrate is provided with a screen portion and a bonding portion adjacent to the screen portion, and a width of the bonding portion is smaller than that of the screen portion; the screen portion comprises the display region, and the bonding portion comprises the bending region; and
    a projection of an edge, proximate to the display region, of the second adhesive layer on the flexible display substrate is coincided with a boundary between the screen portion and the bonding portion.

16. The display assembly according to claim 14, wherein the flexible display substrate is provided with a screen portion and a bonding portion adjacent to the screen portion, and a width of the bonding portion is smaller than that of the screen portion; the screen portion comprises the display region, and the bonding portion comprises the bending region; and a projection of an edge, proximate to the display region, of the second adhesive layer on the flexible display substrate is coincided with a boundary between the screen portion and the bonding portion.

17. The display assembly according to claim 16, wherein an area of the display region accounts for 92.38%-92.48% of an area of the screen portion.

18. A method for preparing a display assembly, comprising:
    preparing the protective film according to claim 1;
    attaching the protective film to the flexible display substrate, and performing ultraviolet curing on the second adhesive layer of the protective film;
    performing a bonding process on the flexible display substrate; and
    removing the base material layer and the first adhesive layer of the protective film from the flexible display substrate.

19. The method for preparing the display assembly according to claim 18, wherein the attaching the protective film to the flexible display substrate comprises:
    attaching the protective film to the mother set, wherein the mother set comprises a plurality of flexible display substrates; and
    the method further comprises: after attaching the protective film to the flexible display substrate, obtaining the flexible display substrate by performing unit cutting on the mother set.

20. A display device, comprising the display assembly according to claim 13.

* * * * *